(12) United States Patent
Hu et al.

(10) Patent No.: US 12,027,496 B2
(45) Date of Patent: Jul. 2, 2024

(54) FILM IN SUBSTRATE FOR RELEASING Z STACK-UP CONSTRAINT

(71) Applicant: Intel Corporation, Santa Clara, CA (US)

(72) Inventors: Jianfeng Hu, Shanghai (CN); Zhicheng Ding, Shanghai (CN); Yong She, Shanghai (CN); Zhijun Xu, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 272 days.

(21) Appl. No.: 17/424,839

(22) PCT Filed: Feb. 22, 2019

(86) PCT No.: PCT/CN2019/075798
§ 371 (c)(1),
(2) Date: Jul. 21, 2021

(87) PCT Pub. No.: WO2020/168530
PCT Pub. Date: Aug. 27, 2020

(65) Prior Publication Data
US 2022/0093568 A1     Mar. 24, 2022

(51) Int. Cl.
*H01L 25/065*     (2023.01)
*H01L 23/00*     (2006.01)
*H01L 25/00*     (2006.01)

(52) U.S. Cl.
CPC .......... *H01L 25/0657* (2013.01); *H01L 24/32* (2013.01); *H01L 24/33* (2013.01);
(Continued)

(58) Field of Classification Search
CPC . H01L 25/0657; H01L 25/0652; H01L 25/50; H01L 25/16; H01L 25/162;
(Continued)

(56) References Cited

U.S. PATENT DOCUMENTS 5,963,794 A    10/1999   Fogal et al.
2005/0248019 A1   11/2005   Chao et al.
(Continued)

OTHER PUBLICATIONS

International Search Report and Written Opinion for International Patent Application No. PCT/CN2019/075798 mailed Nov. 28, 2019, 10 pgs.

*Primary Examiner* — Jasmine J Clark
(74) *Attorney, Agent, or Firm* — Schwabe, Williamson & Wyatt, P.C.

(57) ABSTRACT

Embodiments include semiconductor packages and a method of forming the semiconductor packages. A semiconductor package includes a package substrate with a plurality of cavities, and a plurality of adhesives in the cavities of the package substrate. The semiconductor package also includes a plurality of stacked dies over the adhesives and the package substrate, where the stacked dies are coupled to the adhesives with spacers. The spacers may be positioned below outer edges of the stacked dies. The adhesives may include a plurality of films. The semiconductor package may further include a plurality of interconnects coupled to the stacked dies and package substrate, a plurality of electrical components on the package substrate, a mold layer over the stacked dies, interconnects, spacers, adhesives, and electrical components, and a plurality of adhesive layers coupled to the plurality of stacked dies, where one of the adhesive layers couples the stacked dies to the spacers.

25 Claims, 5 Drawing Sheets

(52) U.S. Cl.
CPC .............. *H01L 24/48* (2013.01); *H01L 24/73* (2013.01); *H01L 24/83* (2013.01); *H01L 25/0652* (2013.01); *H01L 25/50* (2013.01); *H01L 2224/26152* (2013.01); *H01L 2224/32145* (2013.01); *H01L 2224/32237* (2013.01); *H01L 2224/33181* (2013.01); *H01L 2224/48145* (2013.01); *H01L 2224/48225* (2013.01); *H01L 2224/73215* (2013.01); *H01L 2224/73263* (2013.01); *H01L 2924/35121* (2013.01)

(58) Field of Classification Search
CPC ..... H01L 25/165; H01L 25/167; H01L 25/18; H01L 24/32; H01L 24/33; H01L 24/48; H01L 2224/26152; H01L 2224/48091; H01L 2224/73265; H01L 2224/2919; H01L 2224/13155; H01L 2224/13164; H01L 2224/73204; H01L 2924/181; H01L 2924/00014; H10B 80/00; H10N 69/00; H10N 79/00; H10N 89/00
USPC .................................................. 257/777, 783
See application file for complete search history.

(56) References Cited

U.S. PATENT DOCUMENTS

| | | | |
|---|---|---|---|
| 2011/0147911 A1* | 6/2011 | Kohl | ................... H01L 21/6835 438/109 |
| 2016/0343699 A1 | 11/2016 | Ng et al. | |
| 2016/0372452 A1 | 12/2016 | Vadhavkar et al. | |

* cited by examiner

FILM IN SUBSTRATE FOR RELEASING Z STACK-UP CONSTRAINT

CROSS-REFERENCE TO RELATED APPLICATION

This patent application is a U.S. National Phase Application under 35 U.S.C. § 371 of International Application No. PCT/CN2019/075798, filed Feb. 22, 2019, entitled "FILM IN SUBSTRATE FOR RELEASING Z STACK-UP CONSTRAINT," which designates the United States of America, the entire disclosure of which is hereby incorporated by reference in its entirety and for all purposes.

FIELD

Embodiments relate to packaging semiconductor devices. More particularly, the embodiments relate to semiconductor devices having embedded films in substrates (FIS).

BACKGROUND

For the past several decades, the scaling of features in integrated circuits has been a driving force behind an ever-growing semiconductor industry. Scaling to smaller and smaller features enables increased densities of functional units on the limited real estate of semiconductor devices. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Semiconductor devices implement various electrical components into a single semiconductor package. This typically requires increasing the real estate of the package in both the z-height and the overall x-y footprint. These constraints are generally due to stacking multiple dies and disposing multiple active and passive components below the stacked dies. Accordingly, the existing technologies are challenged with such packages by having to balance between increasing the z-height to incorporate the required dies and active/passive components, or hindering the overall efficiency and power requirements.

Some existing technologies are using film over dies (FODs) with semiconductor packages to overcome these challenges. In particular, FODs are being used to facilitate with the unbalanced z-height under the bottommost stacked die. FODs, however, typically occupy a lot of space which requires z-height budgets, and impose other dies to be thinner which increases the risk of the dies cracking during the assembly packaging process. Additionally, uncured FODs can potentially drop and thus induce delamination and mold voids on top of the passive components.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Described herein are semiconductor packages having package substrates with a film in substrate (FIS) and method of forming such semiconductor packages. Embodiments of the semiconductor packages described below and methods of forming such semiconductor packages include stacked dies, electrical components (e.g., passive/active components), interconnects (e.g., wire bonding interconnects), and package substrates, where the package substrates further include embedded one or more FISs. As described herein, a "FIS" (or an embedded FIS) refers to an adhesive, such as a film or any similar adhesive material(s), which may be selectively disposed (or attached) in a cavity of a package substrate, and then embedded (or cured) within the cavity of the package substrate to form the FIS, which ultimately deceases the z-height of the semiconductor package.

An embedded FIS improves packaging solutions by enabling a semiconductor package to eliminate an adhesive layer (e.g., a film on wire (FOW)) that is typically used to couple the stacked dies and spacers, which are generally disposed over/above a top surface of a package substrate. By eliminating the FOW, and embedding the FISs into the cavities of the package substrate, the semiconductor package may dispose the spacers into the embedded FISs—thereby significantly reducing the overall z-height of the semiconductor package.

Figure 1A:
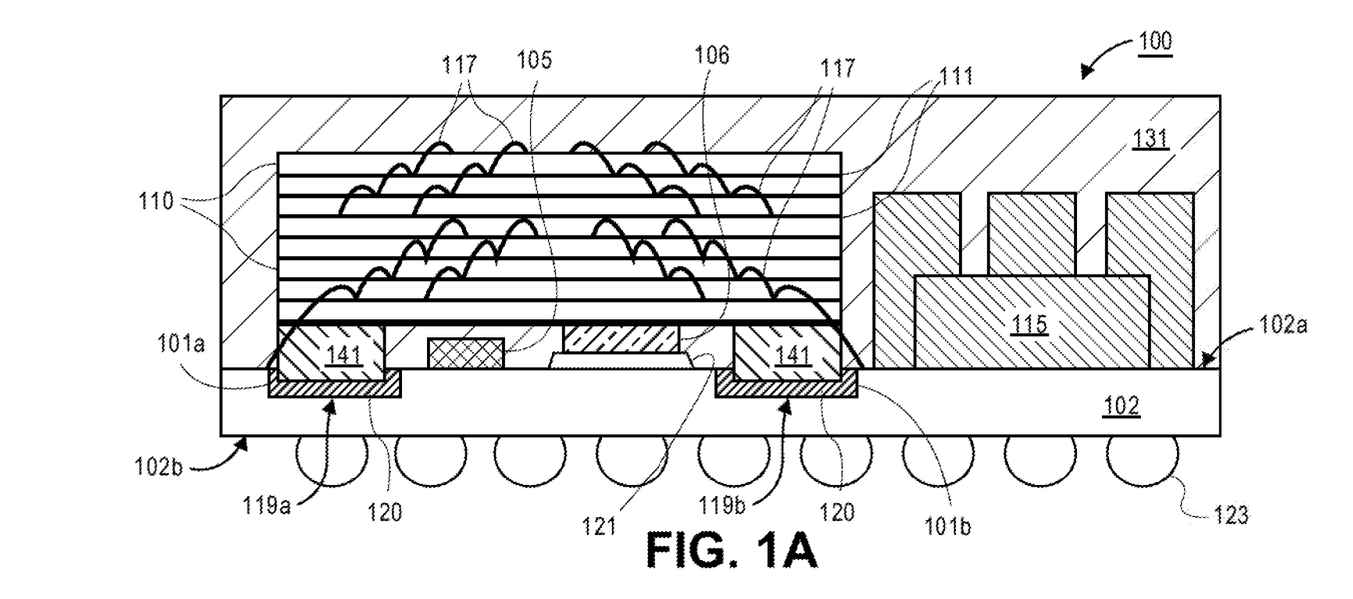
FIG. 1A is a cross-sectional view of a semiconductor package with a plurality of stacked dies, a plurality of electrical components, a plurality of interconnects, and a package substrate with one or more embedded films in substrate (FISs), according to one embodiment.
Figure 1B:
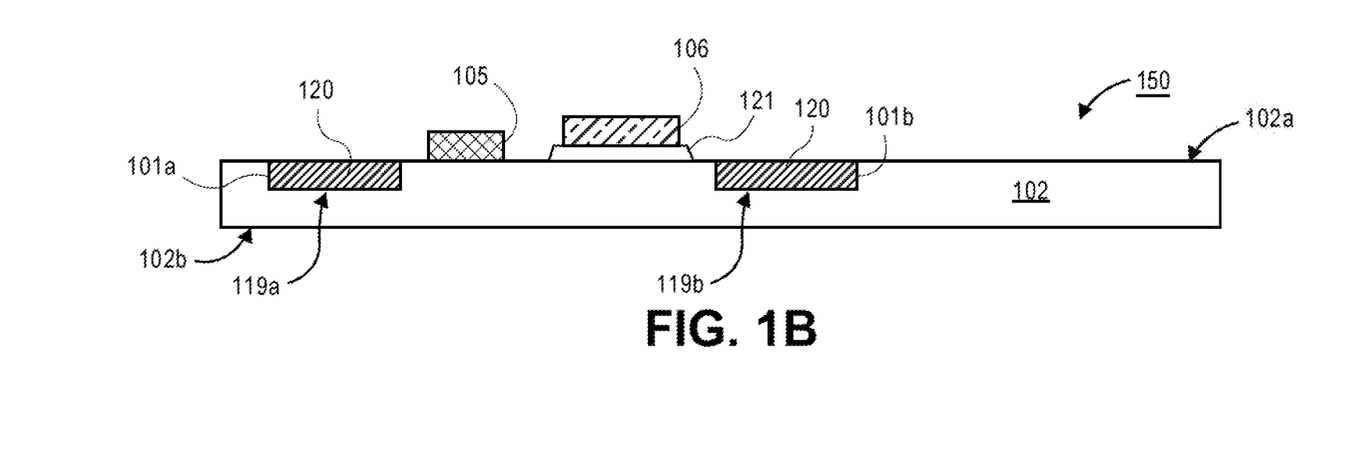
FIG. 1B is a cross-sectional view of a package substrate with a plurality of electrical components and one or more embedded FISs, according to one embodiment.

Accordingly, these embodiments enable the semiconductor packages to overcome the z-height unbalance below the stacked dies—with such components as spacers, passive components, and active components, etc.—by disposing and embedding the selective films in the package substrate (e.g., as shown in FIGS. 1A-1B). Embodiments of the semiconductor packages also improve packaging solutions by (i) providing more z-height budget which thus enables thicker memory dies and lowers the risk of die cracking; and (ii) enlarging the tunnel size which thus eliminates the film over die (FOD) issues of mold flow, and overcomes the mold voids and delamination challenges of existing technologies.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages having stacked dies, electrical components, interconnects, and package substrates, where the package substrates also include embedded FISs.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

FIG. 1A is a cross-sectional view of a semiconductor package 100 with a plurality of stacked dies 110, a plurality of electrical components 105-106 and 115, a plurality of interconnects 117, and a package substrate 102 with one or more FISs 101a-b, according to one embodiment. In addition, FIG. 1B is an enlarged, detailed cross-sectional view of a package substrate 102 with a plurality of electrical components 105-106 and one or more embedded FISs 101a-b, according to one embodiment. The package substrate 102 of FIG. 1B is substantially similar to the package substrate 102 of FIG. 1A, however the package substrate 102 of FIG. 1B illustrates the FISs 101a-b prior to being coupled (or bonded) with the stacked dies and the spacers (as shown in FIG. 1A).

In some embodiments, the semiconductor package 100 includes the plurality of stacked dies 110 with adhesive layers 111 disposed over a top surface 102a of the package substrate 102. In these embodiments, the stacked dies 110 are disposed directly over the spacers 141 which are positioned below the outer edges of the stacked dies 110. The spacers 141 are coupled to the bottommost adhesive layer 111 and the FISs 101a-b. The spacers 141 also enable the electrical components 105-106 to be positioned below the stacked dies 110. For one embodiment, the spacers 141 may be formed of silicon or any similar material(s).

For one embodiment, the stacked dies 110 may include, but are not limited to, a semiconductor die, an electronic device (e.g., a wireless device), an integrated circuit (IC), a central processing unit (CPU), a microprocessor, a platform controller hub (PCH), a memory, and/or a field-programmable gate array (FPGA). As described herein, a "plurality of stacked dies" may refer to a single die or a plurality of dies that are stacked on each other.

In some embodiments, the package substrate 102 may include, but is not limited to, a substrate, a printed circuit board (PCB), and a motherboard. For one embodiment, the package substrate 102 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectrics, where each dielectric layer can be a photosensitive dielectric layer. For some embodiments, holes may be drilled in the PCB 102. For one embodiment, the PCB 102 may also include one or more conductive layers that are used to form traces, vias, pads, planes, and/or the like. In one embodiment, the package substrate 102 may include a plurality of solder balls 123 disposed on a bottom surface 102b of the package substrate 102, which may be used to couple to another substrate (e.g., a motherboard).

As shown in FIG. 1A, the stacked dies 110 include one or more dies that are stacked (or disposed) on top of each other and coupled by using adhesive layers 111. For one embodiment, the adhesive layers 111 (or adhesive films) may be die attach tapes/films. In other embodiments, the adhesive layers 111 may be a ultra-violet (UV) releasable tapes/films, a double-sided release tapes, and/or any other type of adhesive tapes. The stacked dies 110 with the adhesive layer 111 may be stacked directly on top of each other having no offset. In other embodiments, the stacked dies 110 may be stacked on top of each other with an offset between each of the stacked dies 110. In some embodiments, the bottommost die of the stacked dies 110 with the adhesive layer 111 may be disposed directly over the electronic components 105-106, the spacers 141, and the FISs 101a-b.

For some embodiments, the FISs 101a-b (also referred to as embedded FISs) may include an adhesive material 120 (also referred to as an adhesive), such as a film, a tape, or any similar adhesive materials. For example, in one embodiment, the semiconductor package 100 may include disposing (or attaching) the adhesive material 120 into the respective cavities 119a-b to form the FISs 101a-b. In this embodiment, when the adhesive material 120 is a film, for example, the film 120 may be pre-cut prior to disposing (or attaching) the film 120 into the respective cavities 119a-b of the package substrate 102.

The FISs 101a-b may be disposed (or attached) on the top surface 102a of the package substrate 102 by selectively disposing the adhesive material 120 into the cavities 119a-b of the package substrate 102, and then embedding (or curing) the adhesive material 120 within the cavities 119a-b of the package substrate 102. For example, as shown in FIG.

1A, by embedding the FISs 101*a-b* into the cavities 119*a-b* of the package substrate 102, the semiconductor package 100 may dispose the spacers 141 on (or into) the FISs 101*a-b*, and then partially cure the FISs 101*a-b* to couple the spacers 141 to the FISs 101*a-b*, which may accordingly cause portions of the spacers 141 to be embedded into the FISs 101*a-b*. Accordingly, after coupling/attaching the spacers 141 into the FISs 101*a-b*, the top surfaces of the FISs 101*a-b* may have a portion of the top surface that may be above or below the top surface 102*a* of the package substrate 102. That is, in these embodiments, the portion(s) of the top surfaces of the FISs 101*a-b* may have a concave portion and/or a convex portion.

In some embodiments, the FISs 101*a-b* may have a width of approximately 500 μm to 3 mm. For another embodiment, the FISs 101*a-b* may have a width of approximately 500 μm or less based on the desired packaging design. According to some embodiments, the FISs 101*a-b* may have a z-height of approximately 50 μm to 100 μm. For another embodiment, the FISs 101*a-b* may have a z-height of approximately 50 μm or less based on the desired packaging design. Note that the FISs 101*a-b* may be shown to have approximately the same size and dimensions, however the plurality of FISs may have different sizes and dimensions based on the desired packaging design. That is, in alternate embodiments, the FISs 101*a* may have a width and a z-height that is greater or less than a width and a z-height of the FISs 101*b*. Also note that, for illustration purposes, the bottom surface(s) of the FISs 101*a-b* (including the bottom surface(s) of the cavities 119*a-b*) are shown with substantially flat surfaces, but the bottom surfaces of the FISs 101*a-b* may include round surface(s)/portion(s).

As shown in FIG. 1A, the FISs 101*a-b* may have a rectangular shape or a similar shape, where the FISs 101*a-b* may have substantially vertical sidewalls. In other embodiments, the FISs 101*a-b* may have tapered sidewalls, and thus have different shapes such as a trapezoidal shape. Similar to the positioning of the spacers 141, the FISs 101*a-b* are positioned by the outer edges of the stacked dies 110, where the FISs 101*a-b* may have outer edges that extend further than the width of the stacked dies 110. Additionally, note that for simplicity FIG. 1A only illustrates a portion of the semiconductor package 100, but the package substrate 102 may include a plurality of FISs 101*a-b* that are positioned in one or more different patterns based on the positioning of the other additional components on the package substrate 102.

For some embodiments, the stacked dies 110 may be electrically coupled to each other and the package substrate 102 with the plurality of interconnects 117. In some embodiments, the interconnects 117 may be wire bonding interconnects (also referred to as wire bonds) or ribbon bonding interconnects. Accordingly, the stacked dies 110 and the package substrate 102 may be implemented as wire bonded dies and a wire bonded package substrate.

For one embodiment, the interconnects 117 are wire bonding interconnects. The wire bonding interconnects of the semiconductor packages 100 as shown in FIG. 1A may be substantially similar to those presently known in the art. For example, the interconnects 117 may be wires that are ball-stitch bonded or wedge bonded from one stacked die 110 to another stacked die 110 and/or from one stacked die 110 to the package substrate 102. In addition, the interconnects 117 may be any commonly used conductive material, such as copper, silver, gold, and/or any other similar metals or alloys. According to some embodiments, the interconnects 117 are disposed in a cascading pattern in order to allow for the interconnects 117 to have flexibility, particularly in flexibility to change interconnect locations and avoid bending and damage.

As shown in FIG. 1A, the semiconductor package 100 may dispose the electrical components 105-106 and 115 on the top surface 102*a* of the package substrate 102. The electrical components 105-106 and 115 may include passive components, active components, and/or IC dies. For example, the electrical component 105 may be a passive component such as a capacitor; the electrical component 106 may be an active component such as a transistor; and the electrical components 115 may be a large capacitor which may include a heat transferring component. The electrical components 105-106 may be disposed below the stacked dies 110 as the z-height of the electrical components 105-106 is less than the z-height of the spacers 141. In addition, for one embodiment, the electrical component 106 may be disposed and coupled to the top surface 102*a* of the package substrate 102 with a layer 121, where the layer 121 may be a solder layer, an adhesive layer, and/or any similar coupling layer.

In some embodiments, the semiconductor package 100 may include a mold layer 131 that is disposed around and over the stacked dies 110, the electrical components 105-106 and 115, the package substrate 102, and the interconnects 117. In one embodiment, the mold layer 131 may include an epoxy (e.g., a soft epoxy, a stiff epoxy, opaque epoxy, etc.) with one or more filler materials. The mold layer 131 may be selectively disposed, sputtered or deposited on the package substrate 102. That is, the mold layer 131 may be formed with one or more molding/encapsulating processes, such as dispensing/depositing, injection, compression, and/or transfer mold processes.

Referring now to FIG. 1B, a package substrate system 150 with the package substrate 102 is shown. In one embodiment, the package system 150 includes disposing the FISs 101*a-b* and the electrical components 105-106 on the top surface 102*a* of the package substrate 102. The package substrate 102 is substantially similar to the package substrate 102 of FIG. 1A, however the FIG. 1B illustrates the package substrate 102 of FIG. 1A prior to disposing the stacked dies, the spacers, the electrical components, and the mold layer. For example, at this step of the process flow to form a semiconductor package (e.g., the semiconductor package of FIG. 1A), the adhesive material 120 of the FISs 101*a-b* disposed in the cavities 119*a-b* may be in a liquid state prior to disposing the spacers on the FISs 101*a-b* and then partially curing the adhesive material (i.e., partially cured rather than fully cured).

Note that the semiconductor pa as shown in FIGS. 1A-1B may include fewer or additional packaging components based on the desired packaging design.

FIGS. 2A-2E are cross-sectional views of a process flow to form a semiconductor package 200 with a plurality of stacked dies 210, a plurality of electrical components 205-206 and 215, a plurality of interconnects 217, and a package substrate 202 with one or more embedded FISs 201*a-b*, according to one embodiment. In an embodiment, the semiconductor package 200 of FIGS. 2A-2E may be substantially similar to the semiconductor package 100 of FIG. 1A. As such, the components illustrated in FIGS. 2A-2E may also be substantially similar to the components that are illustrated in the semiconductor package 100 of FIG. 1A.

Figure 2A:
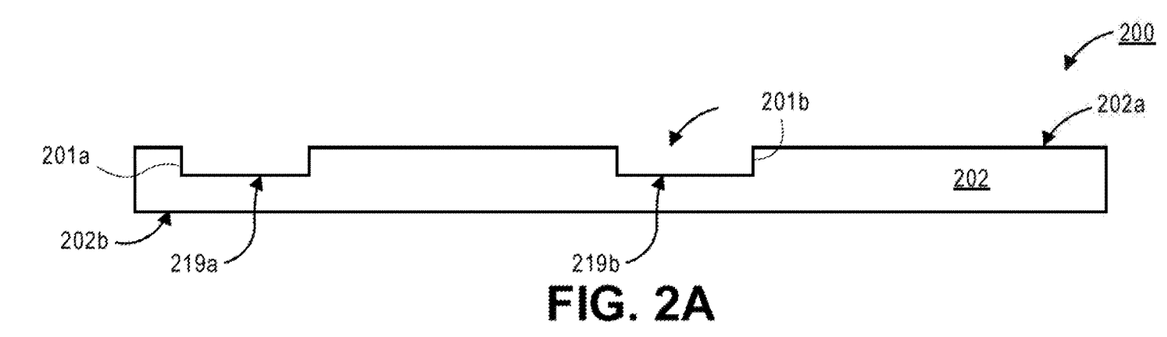
FIGS. 2A-2E are cross-sectional views of a process flow to form a semiconductor package with a plurality of stacked dies, a plurality of electrical components, a plurality of interconnects, and a package substrate with one or more embedded FISs, according to some embodiments.

Referring now to FIG. 2A, a cross-sectional illustration of a semiconductor package 200 with a package substrate 202 is shown, in accordance with an embodiment. In one embodiment, the semiconductor package 200 may include forming one or more cavities 219*a-b* on a top surface 202*a* of the package substrate 202. The package substrate 202 may be substantially similar to the package substrate 102 of FIGS. 1A-1B.

For some embodiments, the one or more cavities 219*a-b* may be formed with any packaging cutting (or removing) technique known in the art. The cavities 219*a-b* are initially formed in the package substrate 102 to provide the shape of the FISs 201*a-b*. As described above, the cavities 219*a-b* may have a rectangular shape, a square shape, a tapered shape, or any other similar shape based on the desired packaging design of the FISs 201*a-b* and the final semiconductor package 200. Note that, in alternate embodiments, this step illustrated in FIG. 2A may be optional as the package substrate 202 may previously include the cavities 219*a-b* prior to forming the semiconductor package 200.

Figure 2B:
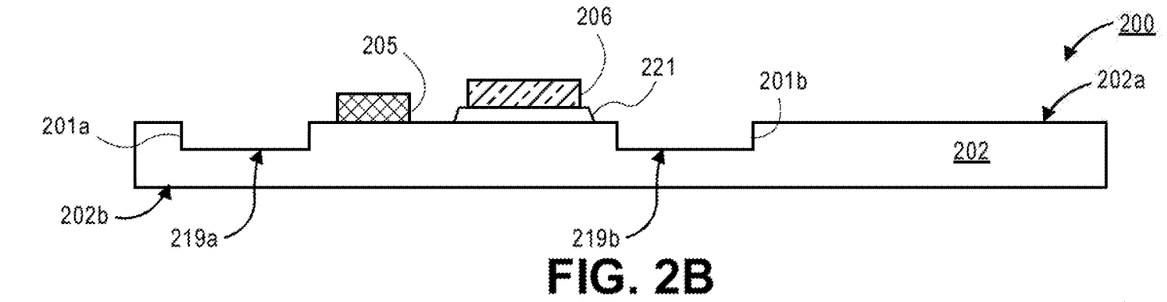

Referring now to FIG. 2B, a cross-sectional illustration of a semiconductor package 200 with the electrical components 205-206 is shown, in accordance with an embodiment. In one embodiment, the semiconductor package 200 may include disposing the electrical components 205-206 on the top surface 202*a* of the package substrate 202. The electrical components 205-206 may be substantially similar to the electrical components 105-106 of FIGS. 1A-1B. For example, in one embodiment, the electrical component 205 may be a passive component such as a capacitor, and the electrical component 206 may be an active component, such as a transistor, which is coupled to the package substrate 202 with a layer 221. The layer 221 may be substantially similar to the layer 121 of FIGS. 1A-1B.

Figure 2C:
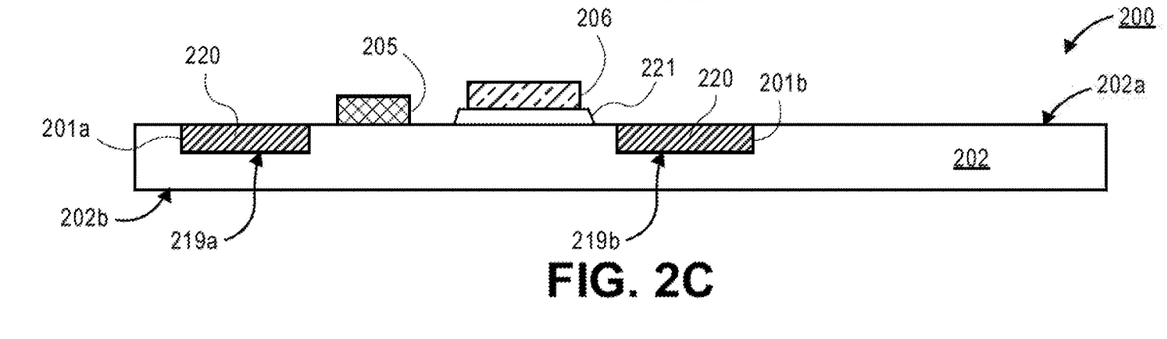

Referring now to FIG. 2C, a cross-sectional illustration of a semiconductor package 200 with FISs 201*a-b* is shown, in accordance with an embodiment. In one embodiment, the semiconductor package 200 may include disposing (or attaching) the adhesive material 220 into the respective cavities 219*a-b* to form the FISs 201*a-b*. As described above, the adhesive material 220 of the FISs 201*a-b* may include a film and/or any similar adhesive material. For example, when the adhesive material 220 is a film, the films 220 may be pre-cut prior to disposing/attaching the films 220 into the cavities 219*a-b* of the package substrate 202. In other embodiments, the adhesive materials 220 may be disposed (or attached) into the cavities 219*a-b* using any known dispensing (or attaching, depositing, etc.) techniques.

Figure 2D:
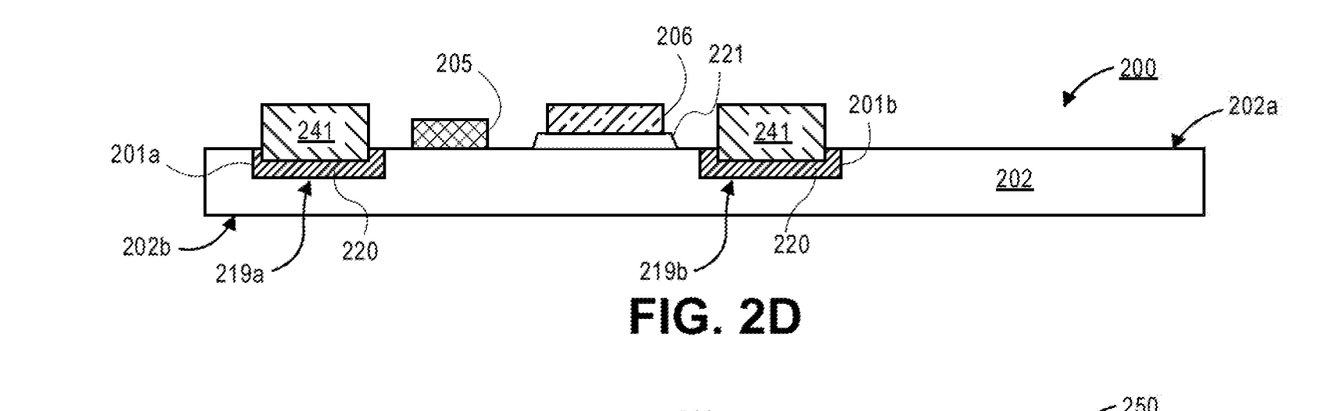

Referring now to FIG. 2D, a cross-sectional illustration of a semiconductor package 200 with the spacers 241 is shown, in accordance with an embodiment. In one embodiment, the semiconductor package 200 may include disposing (or attaching) the spacers 241 on the FISs 201*a-b*. Additionally, after disposing the spacers 241 on the FISs 201*a-b*, the FISs 201*a-b* may be partially cured—rather than fully cured—to couple/attach the spacers 241 to the FISs 201*a-b*, which may thereby cause the bottom portions of the spacers 241 to be embedded in the adhesive material 220 of the FISs 201*a-b*. The spacers 241 may be substantially similar to the spacers 141 of FIG. 1A.

Figure 2E:
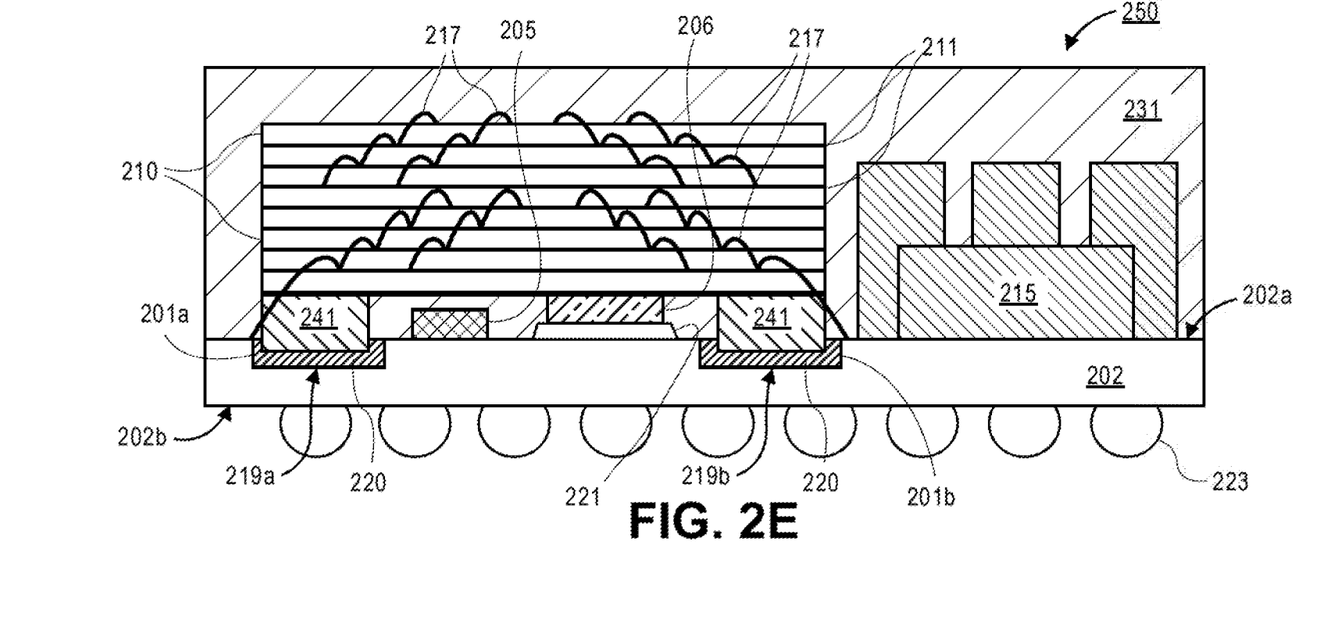

Referring now to FIG. 2E, a cross-sectional illustration of a semiconductor package 200 with the stacked dies 210, the interconnects 217, and the mold layer 231 is shown, in accordance with an embodiment. In one embodiment, the semiconductor package 200 may include disposing the stacked dies 210 with the adhesive layers 211 over the spacers 241, the FISs 201*a-b*, the electrical components 205-206, and the package substrate 202. In particular, in these embodiments, the stacked dies 210 may have one of the adhesive layers 211 disposed below the bottommost die of the stacked dies 210, where this one adhesive layer 211 may be disposed directly above the top surfaces of the spacers 241. Subsequently, after disposing the stacked dies 210 with the adhesive layers 211 on the spacers 241, the semiconductor package 200 may implement a full die-attach curing process to couple (or attach) the stacked dies 210 to the spacers 241 on the FISs 201*a-b*.

Furthermore, the semiconductor package 200 may include coupling the stacked dies 210 and the package substrate 202 with the interconnects 217. The interconnects 217 may be substantially similar to the interconnects 117 of FIG. 1A. The interconnects 217 may be disposed and coupled to the stacked dies 210 and the package substrate 202 using any known interconnect bonding techniques (e.g., a wire bonding interconnect process). The semiconductor package 200 may further include disposing the electrical component 215 (e.g., a large capacitor) on the top surface 202*a* of the package substrate 202.

Lastly, in some embodiments, the semiconductor package 200 may include disposing (or depositing) the mold layer 231 over the stacked dies 210, the interconnects 217, the electrical components 205-206 and 215, the spacers 241, the FISs 201*a-b*, and the package substrate 202. The mold layer 231 may be substantially similar to the mold layer 131 of FIG. 1A. The mold layer 231 may be disposed using any known molding (or encapsulation) techniques.

Note that package substrate 200 as shown in FIGS. 2A-2E may include fewer or additional packaging components based on the desired packaging design.

Figure 3:
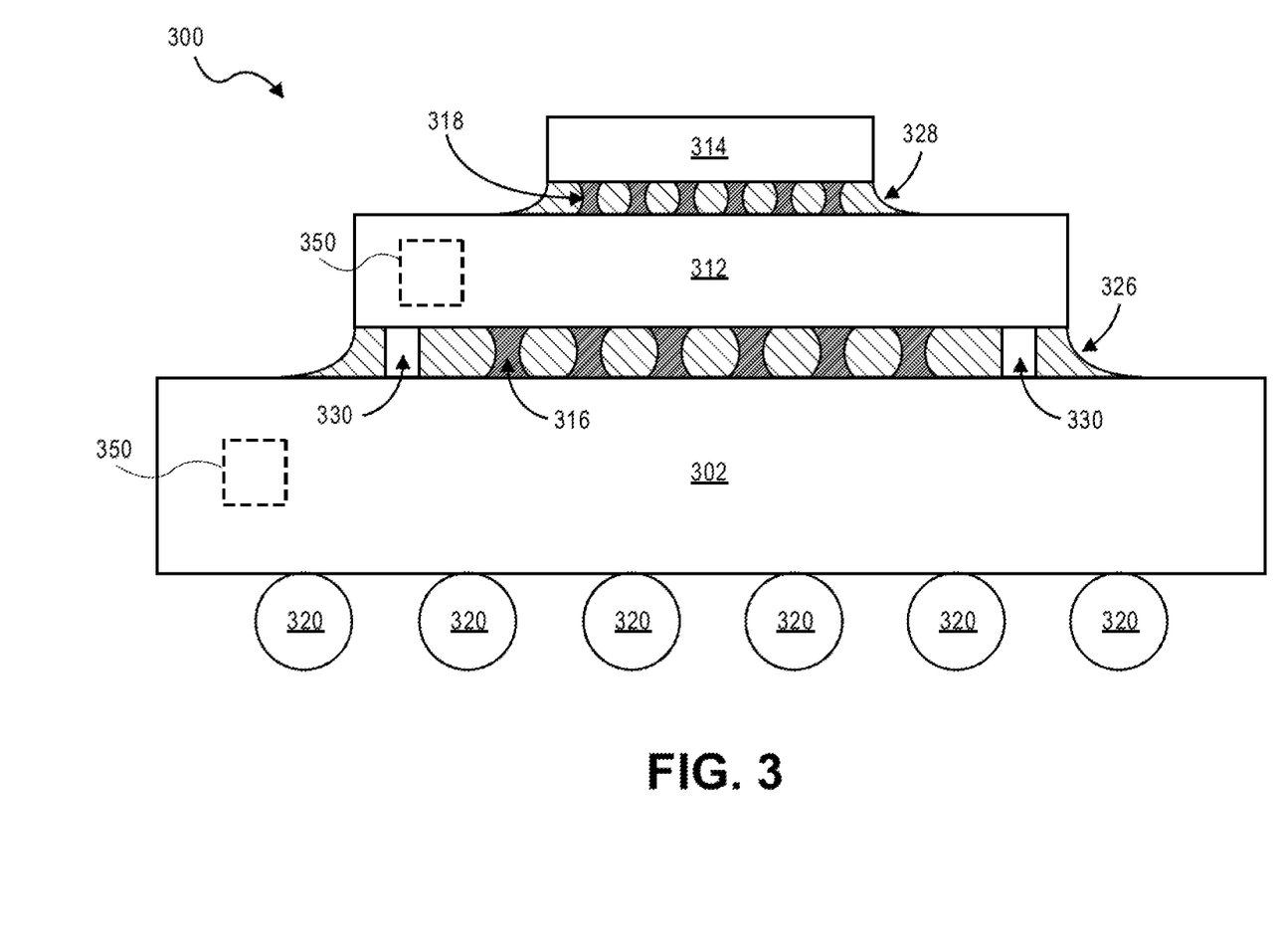
FIG. 3 is an illustration of a cross-sectional view of a semiconductor packaged system including a die, a substrate, a package substrate, and one or more semiconductor packages, according to one embodiment.

FIG. 3 is an illustration of a cross-sectional view of a semiconductor packaged system 300 including a die 314, a substrate 312, a package substrate 302, and one or more semiconductor packages 350, according to one embodiment. FIG. 3 illustrates a semiconductor package 300 including a die 314, a substrate 312 (or an interposer), interconnect structures (e.g., the plurality of bumps disposed below the die 314 and the substrate 312), and the package substrate 302, where the substrate 312 and/or the package substrate 302 may have one or more semiconductor packages 350 having a semiconductor package with a plurality of stacked dies, a plurality of electrical components, a plurality of interconnects, and a package substrate with one or more embedded FISs, according to some embodiments.

For one embodiment, the semiconductor package 300 may implement the substrate 312 and/or the package substrate 302 to include a semiconductor package 350 (as the semiconductor package may be similar to the semiconductor packages described herein) having the stacked dies disposed over the spacers, the FISs, and the package substrate, which also enables having the electrical components disposed between the package substrate and under the stacked dies, according to one embodiment. In one embodiment, the semiconductor package(s) 350 of the substrate 312 and/or the package substrate 302 may be substantially similar to the semiconductor packages 100 and 200 of FIGS. 1-2. Note that the semiconductor package 300 is not limited to the illustrated semiconductor packaged system, and thus may be designed/formed with fewer, alternate, or additional packaging components and/or with different interconnecting structures.

According to one embodiment, the semiconductor package 300 is merely one example of an embodiment of a semiconductor packaged system. For one embodiment, the semiconductor package 300 may include a land grid array (LGA) package and/or a pin grid array (PGA) package. For one embodiment, a die 314 (or an IC die) is coupled to a substrate 312 (e.g., an interposer) via one or more bumps/joints formed from respective microbumps. As described above, a solder joint formed by soldering of a microbump according to an embodiment may itself be referred to as a "bump" and/or a "microbump." Additionally, for other embodiments, the die 314, the substrate 312, and the package substrate 302 may be coupled using anisotropic conductive film (ACF). For one embodiment, the substrate 312 may be, but is not limited to, a silicon interposer and/or a die with through silicon vias (TSVs). For an alternate embodiment, the semiconductor package 300 may omit the interposer/substrate 312.

For some embodiments, the semiconductor package 300 may have the die 314 disposed on the interposer 312, where both the stacked die 314 and interposer 312 are disposed on a package substrate 302. According to some embodiments, the package substrate 302 may include, but is not limited to, a package, a substrate, a PCB, and a motherboard. For one embodiment, the package substrate 302 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 302. For one embodiment, the PCB 302 may also include conductive layers that comprise copper lines/traces, metallic pads, vias, via pads, planes, and/or holes.

For one embodiment, the die 314 may include, but is not limited to, a semiconductor die, an electronic device (e.g., a wireless device), an integrated circuit, a CPU, a microprocessor, a PCH, a memory, and a FPGA. The die 314 may be formed from a material such as silicon and have circuitry thereon that is to be coupled to the interposer 312. Although some embodiments are not limited in this regard, the package substrate 302 may in turn be coupled to another body, for example, a computer motherboard. One or more connections between the package substrate 302, the interposer 312, and the die 314—e.g., including some or all of bumps 316, 318, and 320—may include one or more interconnect structures and underfill layers 326 and 328. In some embodiments, these interconnect structures (or connections) may variously comprise an alloy of nickel, palladium, and tin (and, in some embodiments, Cu).

Connections between the package substrate 302 and another body may be made using any suitable structure, such as the illustrative bumps 320 shown. The package substrate 302 may include a variety of electronic structures formed thereon or therein. The interposer 312 may also include electronic structures formed thereon or therein, which may be used to couple the die 314 to the package substrate 302. For one embodiment, one or more different materials may be used for forming the package substrate 302 and the interposer 312. In certain embodiments, the package substrate 302 is an organic substrate made up of one or more layers of polymer base material, with conducting regions for transmitting signals. In certain embodiments, the interposer 312 is made up of a ceramic base material including metal regions for transmitting signals. Although some embodiments are not limited in this regard, the semiconductor package 300 may include gap control structures 330—e.g., positioned between the package substrate 302 and the interposer 312. Such gap control structures 330 may mitigate a change in the height of the gap between the package substrate 302 and the interposer 312, which otherwise might occur during reflowing while die 314 is attached to interposer 312. Note that the semiconductor package 300 includes an underfill material 328 between the interposer 312 and the die 314, and an underflow material 326 between the package substrate 302 and the interposer 312. For one embodiment, the underfill materials (or layers) 326 and 328 may be one or more polymers that are injected between the layers. For other embodiments, the underfill materials may be molded underfills (MUF).

Note that the semiconductor package 300 may include fewer or additional packaging components based on the desired packaging design.

Figure 4:
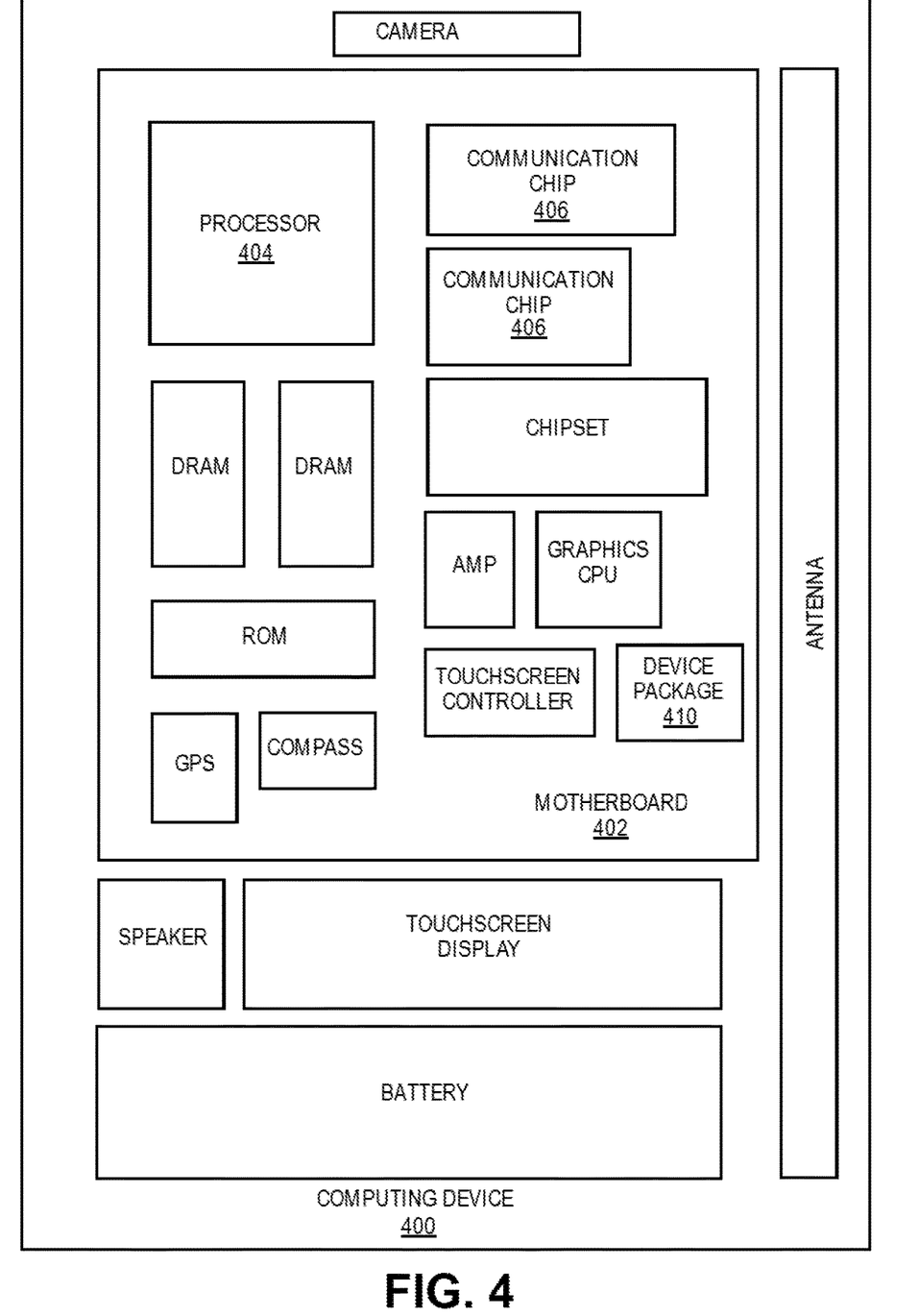
FIG. 4 is an illustration of a schematic block diagram illustrating a computer system that utilizes a semiconductor package with a plurality of stacked dies, a plurality of electrical components, a plurality of interconnects, and a package substrate with one or more embedded FISs, according to one embodiment.

FIG. 4 is an illustration of a schematic block diagram illustrating a computer system 400 that utilizes a device package 410 (or a semiconductor package) with a plurality of stacked dies, a plurality of electrical components, a plurality of interconnects, and a package substrate with one or more embedded FISs, according to some embodiments. FIG. 4 illustrates an example of computing device 400.

Computing device 400 houses motherboard 402. For one embodiment, motherboard 402 may be similar to the substrates 102, 202, and 302 of FIGS. 1-3. Motherboard 402 may include a number of components, including but not limited to processor 404, device package 410 (or semiconductor package), and at least one communication chip 406. Processor 404 is physically and electrically coupled to motherboard 402. For some embodiments, at least one communication chip 406 is also physically and electrically coupled to motherboard 402. For other embodiments, at least one communication chip 406 is part of processor 404.

Depending on its applications, computing device 400 may include other components that may or may not be physically and electrically coupled to motherboard 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

Processor 404 of computing device 400 includes an integrated circuit die packaged within processor 404. Device package 410 may be, but is not limited to, a substrate, a package substrate, and/or a PCB. Device package 410 may include the stacked dies, the electrical components, and the interconnects, and the one or more embedded FISs (e.g., as illustrated in FIGS. 1-3)—or any other components from the figures described herein. The device package 410 of the computing device 400 may thus implement a selectively disposed film in a substrate to decrease the overall z-height, to overcome the z-height unbalance among the spacers, passives, actives, etc., with the FIS, to enable thicker memory dies, to lower the die crack risk, and to enlarge the tunnel size by eliminating the FOD/FOW (which also eliminates mold flow, mold void and delamination issues) (e.g., as compared to existing solutions).

Note that device package 410 may be a single component/device, a subset of components, and/or an entire system, as the materials, features, and components may be limited to device package 410 and/or any other component of the computing device 400 that may need one or more embedded FISs (e.g., the motherboard 402, the processor 404, and/or any other component of the computing device 400 may need the semiconductor packages (or components/structures) as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 406 also includes an integrated circuit die packaged within the communication chip 406. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The Following Examples Pertain to Further Embodiments:

Example 1 is a semiconductor package, comprising: a package substrate with a plurality of cavities; a plurality of adhesives in the plurality of cavities of the package substrate; and a plurality of stacked dies over the plurality of adhesives and the package substrate, wherein the plurality of stacked dies are coupled to the plurality of adhesives with a plurality of spacers.

In example 2, the subject matter of example 1 can optionally include that the plurality of spacers are positioned below outer edges of the plurality of stacked dies.

In example 3, the subject matter of examples 1-2 can optionally include that the plurality of adhesives include a plurality of films.

In example 4, the subject matter of examples 1-3 can optionally include a plurality of interconnects coupled to the plurality of stacked dies and the package substrate; a plurality of electrical components on the package substrate; a mold layer over the plurality of stacked dies, the plurality of interconnects, the plurality of spacers, the plurality of adhesives, and the plurality of electrical components; and a plurality of adhesive layers coupled to the plurality of stacked dies, wherein one of the adhesive layers couples the plurality of stacked dies to the spacers.

In example 5, the subject matter of examples 1-4 can optionally include that the plurality of interconnects are wire bond interconnects.

In example 6, the subject matter of examples 1-5 can optionally include that the plurality of adhesives have a z-height of approximately 50 μm to 100 μm.

In example 7, the subject matter of examples 1-6 can optionally include that the plurality of adhesives have a width of approximately 500 μm to 3 mm.

In example 8, the subject matter of examples 1-7 can optionally include that the plurality of electrical components includes passive components, active components, or integrated circuit dies, and wherein one or more of the plurality of electrical components are disposed below the stacked dies.

In example 9, the subject matter of examples 1-8 can optionally include that the plurality of spacers have bottom portions that are embedded into the plurality of adhesives, wherein the plurality of adhesive have a width that is greater than a width of the plurality of spacers, and wherein the cavities include vertical sidewalls or tapered sidewalls.

Example 10 is a method of forming a semiconductor package, comprising: disposing a plurality of cavities into a package substrate; disposing a plurality of adhesives into the plurality of cavities of the package substrate; and disposing a plurality of stacked dies over the plurality of adhesives and the package substrate, wherein the plurality of stacked dies are coupled to the plurality of adhesives with a plurality of spacers.

In example 11, the subject matter of example 10 can optionally include that the plurality of spacers are positioned below outer edges of the plurality of stacked dies.

In example 12, the subject matter of examples 10-11 can optionally include that the plurality of adhesives include a plurality of films.

In example 13, the subject matter of examples 10-12 can optionally include a plurality of interconnects to the plurality of stacked dies and the package substrate; disposing a plurality of electrical components on the package substrate; disposing a mold layer over the plurality of stacked dies, the plurality of interconnects, the plurality of spacers, the plurality of adhesives, and the plurality of electrical components; and coupling a plurality of adhesive layers to the plurality of stacked dies, wherein one of the adhesive layers couples the plurality of stacked dies to the spacers.

In example 14, the subject matter of examples 10-13 can optionally include that the plurality of interconnects are wire bond interconnects.

In example 15, the subject matter of examples 10-14 can optionally include that the plurality of adhesives have a z-height of approximately 50 μm to 100 μm.

In example 16, the subject matter of examples 10-15 can optionally include that the plurality of adhesives have a width of approximately 500 μm to 3 mm.

In example 17, the subject matter of examples 10-16 can optionally include that the plurality of electrical components includes passive components, active components, or integrated circuit dies, and wherein one or more of the plurality of electrical components are disposed below the stacked dies.

In example 18, the subject matter of examples 10-17 can optionally include that the plurality of spacers have bottom portions that are embedded into the plurality of adhesives, wherein the plurality of adhesive have a width that is greater than a width of the plurality of spacers, and wherein the cavities have vertical sidewalls or tapered sidewalls.

Example 19 is a semiconductor packaging system, comprising: a substrate on a package substrate; a die on the substrate; a plurality of cavities in the package substrate; a plurality of adhesives in the plurality of cavities of the package substrate; and a plurality of stacked dies over the plurality of adhesives and the package substrate, wherein the plurality of stacked dies are coupled to the plurality of adhesives with a plurality of spacers.

In example 20, the subject matter of example 19 can optionally include that the plurality of spacers are positioned below outer edges of the plurality of stacked dies, and wherein the plurality of adhesives includes a plurality of films.

In example 21, the subject matter of examples 19-20 can optionally include a plurality of interconnects coupled to the plurality of stacked dies and the package substrate; a plurality of electrical components on the package substrate; a mold layer over the plurality of stacked dies, the plurality of interconnects, the plurality of spacers, the plurality of adhesives, and the plurality of electrical components; and a plurality of adhesive layers coupled to the plurality of stacked dies, wherein one of the adhesive layers couples the plurality of stacked dies to the spacers.

In example 22, the subject matter of examples 19-21 can optionally include that the plurality of interconnects are wire bond interconnects.

In example 23, the subject matter of examples 19-22 can optionally include that the plurality of adhesives have a z-height of approximately 50 µm to 100 µm, and wherein the plurality of adhesives have a width of approximately 500 µm to 3 mm.

In example 24, the subject matter of examples 19-23 can optionally include that the plurality of electrical components includes passive components, active components, or integrated circuit dies, and wherein one or more of the plurality of electrical components are disposed below the stacked dies.

In example 25, the subject matter of examples 19-24 can optionally include that the plurality of spacers have bottom portions that are embedded into the plurality of adhesives, wherein the plurality of adhesive have a width that is greater than a width of the plurality of spacers, and wherein the cavities have vertical sidewalls or tapered sidewalls.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A semiconductor package, comprising:
    a package substrate with a plurality of cavities;
    a plurality of adhesives, wherein individual ones of the plurality of adhesives are in a corresponding one of the plurality of cavities of the package substrate; and
    a plurality of stacked dies over the plurality of adhesives and the package substrate, wherein the plurality of stacked dies are coupled to the plurality of adhesives with a plurality of spacers.

2. The semiconductor package of claim 1, wherein the plurality of spacers are positioned below outer edges of the plurality of stacked dies.

3. The semiconductor package of claim 1, wherein each of the individual ones of the plurality of adhesives includes a plurality of films.

4. The semiconductor package of claim 1, further comprising:
    a plurality of interconnects coupled to the plurality of stacked dies and the package substrate;
    a plurality of electrical components on the package substrate;
    a mold layer over the plurality of stacked dies, the plurality of interconnects, the plurality of spacers, the plurality of adhesives, and the plurality of electrical components; and
    a plurality of adhesive layers coupled to the plurality of stacked dies, wherein one of the adhesive layers couples the plurality of stacked dies to the spacers.

5. The semiconductor package of claim 4, wherein the plurality of interconnects are wire bond interconnects.

6. The semiconductor package of claim 4, wherein the plurality of electrical components includes passive components, active components, or integrated circuit dies, and wherein one or more of the plurality of electrical components are disposed below the stacked dies.

7. The semiconductor package of claim 1, wherein the plurality of adhesives have a z-height of approximately 50 µm to 100 µm.

8. The semiconductor package of claim 1, wherein the plurality of adhesives have a width of approximately 500 µm to 3 mm.

9. The semiconductor package of claim 1, wherein the plurality of spacers have bottom portions that are embedded in the plurality of adhesives, wherein the plurality of adhesive have a width that is greater than a width of the plurality of spacers, and wherein the cavities include vertical sidewalls or tapered sidewalls.

10. A method of forming a semiconductor package, comprising:
    disposing a plurality of cavities into a package substrate;
    disposing a plurality of adhesives into the plurality of cavities of the package substrate, wherein individual ones of the plurality of adhesives are in a corresponding one of the plurality of cavities; and
    disposing a plurality of stacked dies over the plurality of adhesives and the package substrate, wherein the plurality of stacked dies are coupled to the plurality of adhesives with a plurality of spacers.

11. The method of claim 10, wherein the plurality of spacers are positioned below outer edges of the plurality of stacked dies.

12. The method of claim 10, wherein each of the individual ones of the plurality of adhesives includes a plurality of films.

13. The method of claim 10, further comprising:
    coupling a plurality of interconnects to the plurality of stacked dies and the package substrate; disposing a plurality of electrical components on the package substrate;

disposing a mold layer over the plurality of stacked dies, the plurality of interconnects, the plurality of spacers, the plurality of adhesives, and the plurality of electrical components; and coupling a plurality of adhesive layers to the plurality of stacked dies, wherein one of the adhesive layers couples the plurality of stacked dies to the spacers.

14. The method of claim 13, wherein the plurality of interconnects are wire bond interconnects.

15. The method of claim 13, wherein the plurality of electrical components includes passive components, active components, or integrated circuit dies, and wherein one or more of the plurality of electrical components are disposed below the stacked dies.

16. The method of claim 10, wherein the plurality of adhesives have a z-height of approximately 50 μm to 100 μm.

17. The method of claim 10, wherein the plurality of adhesives have a width of approximately 500 μm to 3 mm.

18. The method of claim 10, wherein the plurality of spacers have bottom portions that are embedded in the plurality of adhesives, wherein the plurality of adhesive have a width that is greater than a width of the plurality of spacers, and wherein the cavities have vertical sidewalls or tapered sidewalls.

19. A semiconductor packaging system, comprising:
a substrate on a package substrate; a die on the substrate;
a plurality of cavities in the package substrate;
a plurality of adhesives, wherein individual ones of the plurality of adhesives are in a corresponding one of the plurality of cavities of the package substrate; and
a plurality of stacked dies over the plurality of adhesives and the package substrate, wherein the plurality of stacked dies are coupled to the plurality of adhesives with a plurality of spacers.

20. The semiconductor packaging system of claim 19, wherein the plurality of spacers are positioned below outer edges of the plurality of stacked dies, and wherein each of the individual ones of the plurality of adhesives includes a plurality of films.

21. The semiconductor packaging system of claim 19, further comprising:
a plurality of interconnects coupled to the plurality of stacked dies and the package substrate;
a plurality of electrical components on the package substrate;
a mold layer over the plurality of stacked dies, the plurality of interconnects, the plurality of spacers, the plurality of adhesives, and the plurality of electrical components; and
a plurality of adhesive layers coupled to the plurality of stacked dies, wherein one of the adhesive layers couples the plurality of stacked dies to the spacers.

22. The semiconductor packaging system of claim 21, wherein the plurality of interconnects are wire bond interconnects.

23. The semiconductor packaging system of claim 19, wherein the plurality of adhesives have a z-height of approximately 50 μm to 100 μm, and wherein the plurality of adhesives have a width of approximately 500 μm to 3 mm.

24. The semiconductor packaging system of claim 21, wherein the plurality of electrical components includes passive components, active components, or integrated circuit dies, and wherein one or more of the plurality of electrical components are disposed below the stacked dies.

25. The semiconductor packaging system of claim 19, wherein the plurality of spacers have bottom portions that are embedded in the plurality of adhesives, wherein the plurality of adhesive have a width that is greater than a width of the plurality of spacers, and wherein the cavities have vertical sidewalls or tapered sidewalls.

* * * * *